(12) United States Patent
Perry

(10) Patent No.: US 7,064,447 B2
(45) Date of Patent: Jun. 20, 2006

(54) BOND PAD STRUCTURE COMPRISING MULTIPLE BOND PADS WITH METAL OVERLAP

(75) Inventor: Guy Perry, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 09/927,675

(22) Filed: Aug. 10, 2001

(65) Prior Publication Data

US 2003/0030153 A1    Feb. 13, 2003

(51) Int. Cl.
*H01L 23/52* (2006.01)
*H01L 23/48* (2006.01)
*H01L 29/40* (2006.01)

(52) U.S. Cl. ............ 257/781; 257/778; 257/779; 257/782; 438/612; 438/666

(58) Field of Classification Search ........ 257/784, 257/786, E23.015, E23.02–E23.026, 48, 257/778–782, 773–776, E21.627, E21.641, 257/E23.016, E23.019; 438/612, 666
See application file for complete search history.

(56) References Cited

U.S. PATENT DOCUMENTS

| | | | | |
|---|---|---|---|---|
| 4,184,909 A | | 1/1980 | Chang et al. ............ | 438/624 |
| 4,621,045 A | * | 11/1986 | Goodner .................. | 430/311 |
| 4,721,689 A | | 1/1988 | Chaloux et al. .......... | 438/618 |
| 5,292,624 A | | 3/1994 | Wei ........................ | 430/313 |
| 5,384,284 A | | 1/1995 | Doan et al. .............. | 437/190 |
| 5,480,834 A | | 1/1996 | Lake et al. .............. | 437/183 |
| 5,506,499 A | | 4/1996 | Puar ....................... | 324/158.1 |
| 5,706,578 A | * | 1/1998 | Hubner .................... | 29/830 |
| 5,721,496 A | | 2/1998 | Farnworth et al. ....... | 324/765 |
| 5,796,746 A | | 8/1998 | Farnworth et al. ....... | 371/21.1 |
| 5,854,513 A | * | 12/1998 | Kim ........................ | 257/737 |
| 5,859,442 A | | 1/1999 | Manning .................. | 257/48 |
| 5,869,869 A | * | 2/1999 | Hively ..................... | 257/355 |
| 5,883,435 A | * | 3/1999 | Geffken et al. ........... | 257/758 |
| 5,900,643 A | * | 5/1999 | Preslar et al. ............ | 257/48 |
| 5,918,107 A | | 6/1999 | Fogal et al. .............. | 438/15 |
| 6,018,462 A | * | 1/2000 | Sakuyama ................ | 361/777 |
| 6,078,100 A | * | 6/2000 | Duesman et al. ......... | 257/690 |
| 6,204,072 B1 | | 3/2001 | Wright et al. ............ | 438/14 |
| 6,240,535 B1 | | 5/2001 | Farnworth et al. ....... | 714/718 |
| 6,300,688 B1 | * | 10/2001 | Wong ...................... | 257/786 |
| 6,420,664 B1 | * | 7/2002 | Muramatsu et al. ...... | 174/262 |

(Continued)

FOREIGN PATENT DOCUMENTS

JP        07312478 A    *    11/1995

*Primary Examiner*—Kenneth Parker
*Assistant Examiner*—Chris C. Chu
(74) *Attorney, Agent, or Firm*—Whyte Hirschboeck Dudek SC

(57) ABSTRACT

A bond pad structure comprising two bond pads, methods of forming the bond pad structure, an integrated circuit die incorporating the bond pad structure, and methods of using the bond pad structure are provided. Each of the bond pads comprise stacked metal layers, at least one lower metal layer and an upper metal layer. When the two pads are connected by a conductive material, they function as a single pad. The lower metal layer of one of the bond pads forms an extension that extends beneath the upper metal layer of the other of the bond pad. The lower metal extension functions to block the etching of a dielectric layer that is put down over the upper metal layers and the underlying substrate, for example, during a passivation etch to form the bond pad opening, to protect the substrate from damage.

53 Claims, 6 Drawing Sheets

U.S. PATENT DOCUMENTS

| | | | |
|---|---|---|---|
| 6,424,028 B1 | 7/2002 | Dickinson | 257/678 |
| 6,455,943 B1 * | 9/2002 | Sheu et al. | 257/786 |
| 6,465,892 B1 * | 10/2002 | Suga | 257/777 |
| 6,495,917 B1 * | 12/2002 | Ellis-Monaghan et al. | 257/758 |
| 6,504,252 B1 * | 1/2003 | Matsunaga | 257/758 |
| 6,509,643 B1 * | 1/2003 | Ohtaka et al. | 257/712 |
| 6,597,187 B1 | 7/2003 | Eldridge et al. | 324/754 |
| 6,621,260 B1 | 9/2003 | Eldridge et al. | 324/158.1 |
| 6,656,828 B1 * | 12/2003 | Maitani et al. | 438/613 |
| 6,770,906 B1 | 8/2004 | Corbett et al. | 257/48 |
| 6,852,999 B1 | 2/2005 | Farnworth et al. | 257/48 |
| 6,952,371 B1 | 10/2005 | Koelling et al. | 365/189.09 |

* cited by examiner

US 7,064,447 B2

BOND PAD STRUCTURE COMPRISING MULTIPLE BOND PADS WITH METAL OVERLAP

FIELD OF THE INVENTION

The present invention relates generally to fabrication of integrated circuit devices and, more particularly, to a bond pad construction and methods for forming and using the bond pad structure.

BACKGROUND OF THE INVENTION

Integrated circuits (IC) are typically tested before they are packaged to determine if they have any failing circuitry. A series of bond pads on the die, referred to as test bond pads, are used in testing a die. In general, one of the first steps in testing a die is to initiate a test mode in the die by applying control signals to the test bond pads. After the test is completed, a signal is sent to the test bond pads to short them out and disable them.

In some constructions, the test bond pad is not disabled but is converted to an operational mode. However, in shorting a fuse or using a high voltage to disable a transistor to terminate the test mode, leakage problems can result. The separation of the test mode from the operational mode would help solve this problem. The separation would also protect operational devices from high voltages during testing. It would be desirable to provide such a structure in the form of two separate bond pads, one bond pad functional in a test mode and, when connected to the other bond pad, both functioning as a single pad in a operational mode. In fabricating such a bond pad structure, consideration must be given to the structuring of the two bond pads in conjunction with each other.

SUMMARY OF THE INVENTION

The present invention encompasses methods of forming bond pad structures in a semiconductor fabrication, bond pad structures formed from such methods, integrated circuit die incorporating the bond pad structure, and methods of utilizing the bond pad structures in testing and operating a semiconductor device.

In one aspect, the invention provides a bond pad structure in a semiconductor device, the bond pad structure comprising two bond pads within a bond pad opening. In an embodiment of the bond pad structure, each of the bond pads comprise stacked metal layers of an upper metal layer and at least one lower metal layer. The bond pads are structured such that the lower metal layer of one of the bond pads extends beneath the upper metal layer of the other of the bond pads. The bond pads can comprise multiple lower metal layers with one or more layers of one bond pad extending underneath the upper metal layer of the other bond pad. The metal layers are in essence, interwoven or staggered to protect the underlying substrate. The extension of a lower metal layer beneath an upper metal layer functions as an etch block to prevent etching of a dielectric (insulating) layer between the first and second bond pads down to the underlying substrate, which can occur during etching of the passivation layer to form the bond pad opening.

The bond pad structure comprises a first metal layer deposited onto a substrate and patterned by dry etching to form two lower metal layers with a space thereinbetween; a dielectric layer deposited over the lower metal layers and the exposed substrate within the space and etched to form openings to each of the two lower metal layers; a second metal layer deposited over the dielectric layer and into the openings of the dielectric layer and etched to form two upper metal layers overlying the two lower metal layers, resulting in the two bond pads, each comprising stacked upper and lower metal layers. According to the invention, the lower metal layers are etched such that a lower metal layer of one of the bond pads extends underneath the upper metal layer of the other of the bond pads to form an interwoven layered structure. A passivation layer can be formed over the upper metal layers and etched to form a bond pad opening to expose the two bond pads. The staggering of a lower metal layer beneath an upper metal layer forms an etch block during etching of a passivation layer to protect the underlying substrate. The bond pads can be interconnected by a conductive material.

The bond pads can function to supply data, retrieve data, test a device, and supply various voltages for testing or programming. An exemplary bond pad structure comprises a test mode bond pad not connected to and separate from an operational mode bond pad. When the test sequence is complete, the test mode of the test mode bond pad is disabled. The two pads are then connected during wire bonding, and the resulting joined bond pads function in an operational mode. The bond pads can be interconnected, for example, by a solder material that is used in the connection of a wire bond to the surface of the bond pad structure.

In an embodiment of the bond pad structure, the lower metal layer of the first bond pad (e.g., operational mode bond pad) can extend underneath the upper metal layer of the second bond pad (e.g., test mode bond pad). In another embodiment of the bond pad structure, the lower metal layer of the second bond pad (e.g., a test mode bond pad) can extend underneath the upper metal layer of the first bond pad (e.g., an operational mode bond pad). In yet another embodiment, each of the bond pads can comprise a plurality of lower metal layers whereby at least one of the lower metal layers of one of the bond pads extends underneath the upper metal layer of the other of the bond pads.

In another aspect, the invention encompasses an integrated circuit die comprising the bond pad structure of the invention.

In yet another aspect, the invention provides a method of forming a bond pad structure as described herein, comprising a first and second bond pad. In one embodiment, the method of the invention comprises the steps of: depositing a first metal layer onto a substrate; etching the first metal layer to form first and second lower metal layers having a space thereinbetween; depositing a dielectric layer over the first and second lower metal layers and into said space thereinbetween; etching the dielectric layer to form openings to each of the first and second lower metal layers; depositing a second metal layer over the dielectric layer and into the openings of the dielectric layer; and etching the second metal layer to form first and second upper metal layers having a space thereinbetween. The resulting bond pad structure comprises a first bond pad comprising the first upper metal layer overlying the first lower metal, and a second bond pad comprising the second upper metal layer overlying the second lower metal layer.

The method can further comprise forming a passivation layer over the first and second upper metal layers and into the space thereinbetween; and etching the passivation layer to form an opening to expose the first and second upper metal layers of the bond pads. The lower metal layer of one bond pad extends underneath the upper layer of the other bond pad and functions to block the etching of a dielectric layer that is deposited over the lower metal layers and the underlying substrate, and to protect the substrate from damage, for example, during etching of the passivation layer to form the bond pad opening. The method can further comprise the steps of connecting a bonding wire to one of the bond pads, and interconnecting the bond pads with a conductive material such as a solder material used in the attachment of the bonding wire.

In yet another aspect of the invention, a method of testing and/or operating an integrated circuit using an integrated circuit die comprising a bond pad structure as described herein, is provided. An embodiment of a bond pad structure of an integrated circuit die for use in testing and operating circuitry, comprises a first bond pad which is a test mode bond pad that receives and responds to a test mode signal and, after the test sequence is complete and the first and a second bond pad of the bond pad structure are interconnected with a conductive material, the first and second bond pads function as a single unit to receive and respond to any signal.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

Figure 1A:
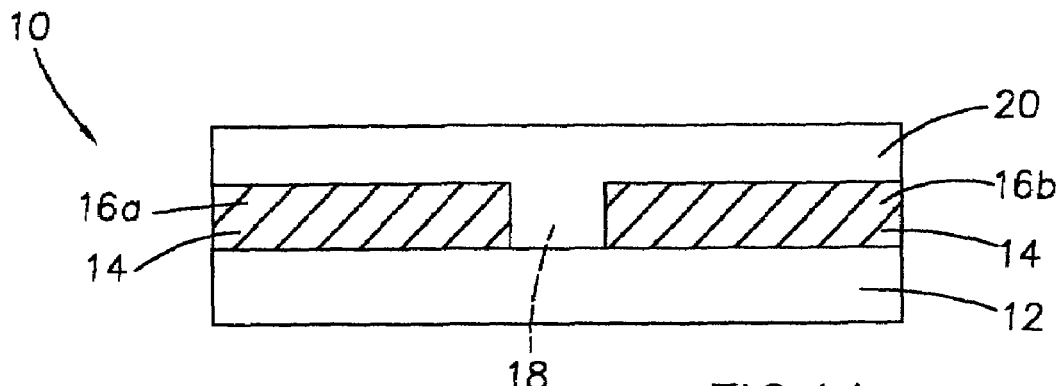
FIGS. 1A–1D are diagrammatic cross-sectional views of a semiconductor wafer at subsequent and sequential processing steps, showing fabrication of a bond pad structure.

It is desirable to provide a set of bond pads comprising a first bond pad and a second adjacent bond pad that can function independently, or as a single unit upon being interconnected by a conductive material. The fabrication of such a bond pad structure is depicted in FIG. 1A. The illustration illustrates a design flaw in the bond pad structure that is overcome by the present invention, as will be described and illustrated with reference to FIGS. 2A–2I.

As shown in FIG. 1A, a semiconductor wafer fragment 10 is shown as comprising a substrate 12, which can comprise a semiconductor wafer substrate or the wafer along with various process layers formed thereon, including one or more semiconductor layers or other formations, and active or operable portions of semiconductor devices. The bond pad structure 40 comprises a first bond pad 28 and a second bond pad 30, each formed from two overlying stacks of metal, although additional layers of metal can be utilized.

Referring to FIG. 1A, in fabricating the bond pad structure 40, a first metal layer 14 has been deposited onto the substrate 12 and patterned by dry etching resulting in a lower metal layer 16a of the first bond pad 28, and a lower metal layer 16b of the second bond pad 30, having a space 18 thereinbetween. A dielectric layer 20 such as $SiO_2$ has been deposited over the lower metal layers 16a, 16b and into the space 18 to electrically isolate the two lower metal layers 16a, 16b from each other, and to isolate the lower metal layers 16a, 16b from the upper metal layers 26a, 26b of the second metal layer 24.

Figure 1B:
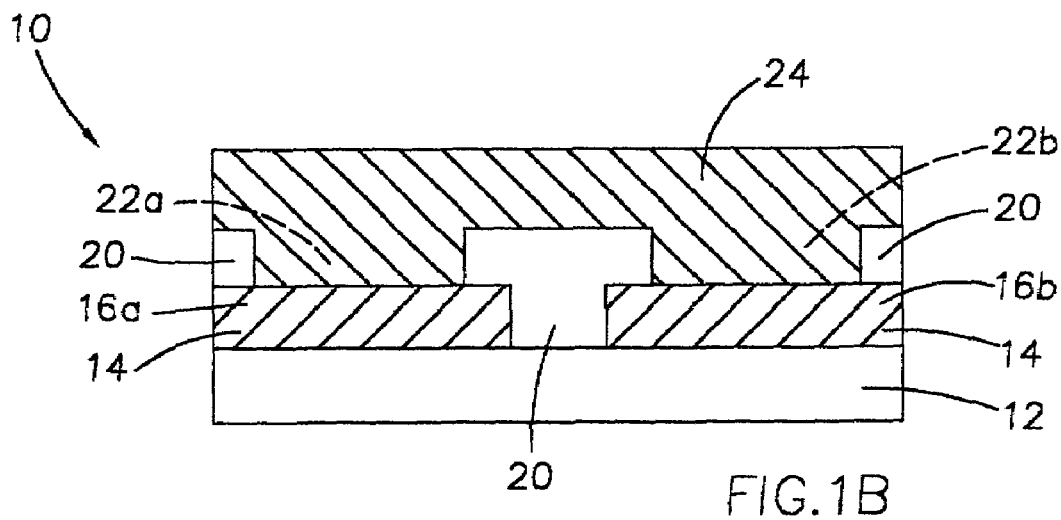

Referring now to FIG. 1B, the dielectric layer 20 has been etched to provide vias or openings 22 to allow electrical connection between the first and second metal layers 14, 24. A second metal layer 24 has been deposited over the dielectric layer 20 and into the openings 22a, 22b.

Figure 1C:
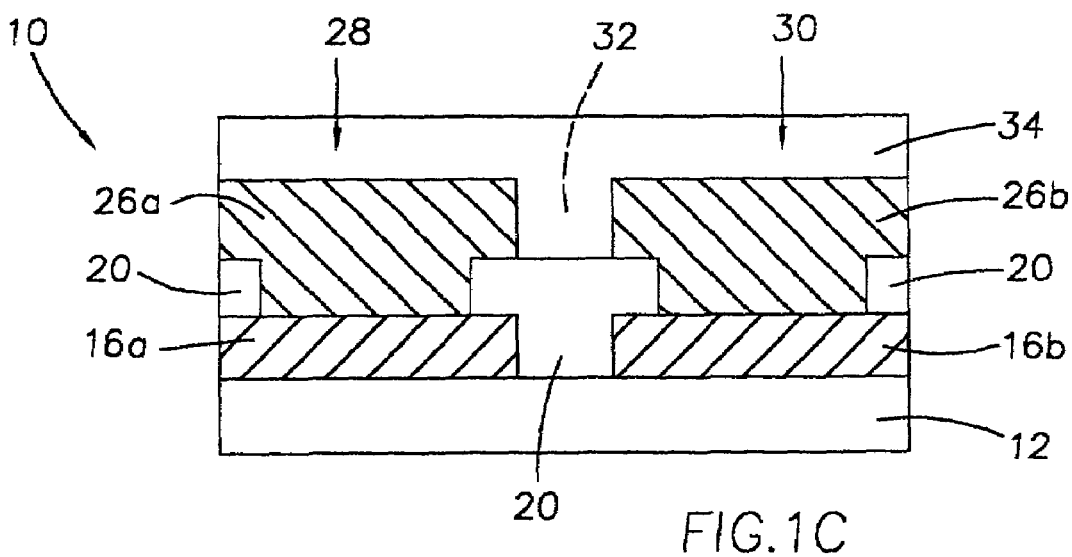

As shown in FIG. 1C, the second metal layer 24 has been patterned by dry etching to form an upper metal layer 26a of the first bond pad 28 and an upper metal layer 26b of the second bond pad 30, which are separated by a space 32. In addition, a passivation layer 34 has been put down on the wafer surface to seal the device structures from contamination and moisture, and as a scratch protection layer.

Figure 1D:
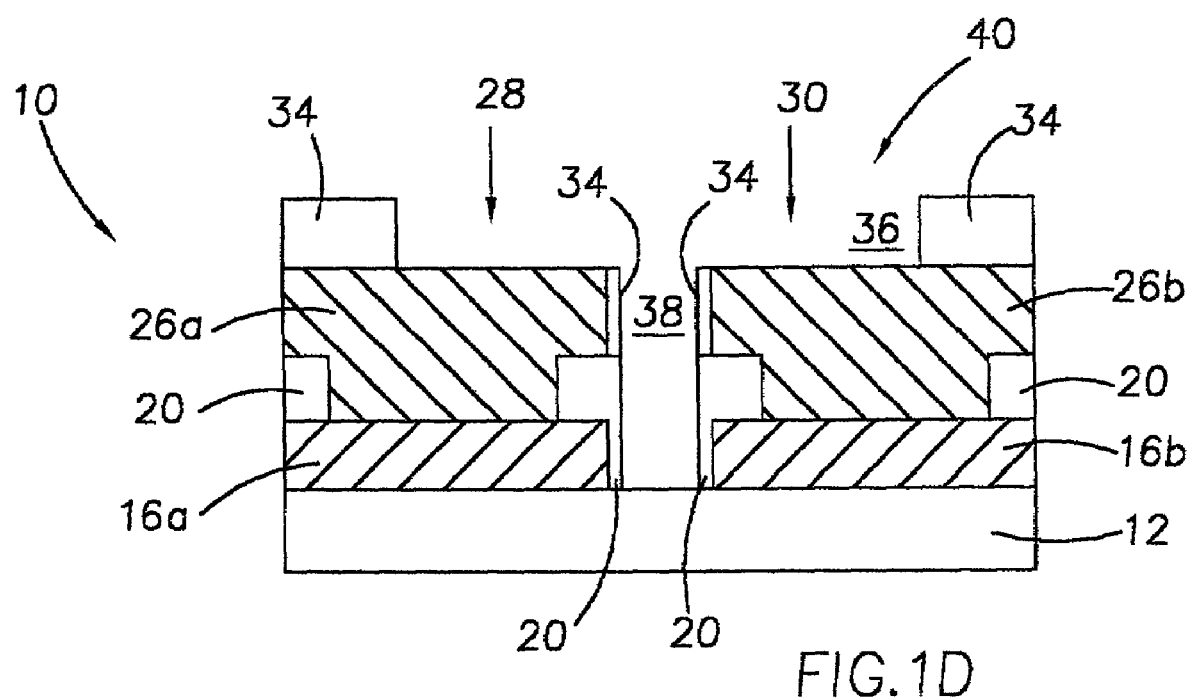

In a conventional approach, as seen in FIG. 1D, an opening 36 has been etched into the passivation layer 34 to expose the set of bond pads 28, 30, which form the bond pad structure 40.

A disadvantage of the construction shown in FIG. 1D, is that, due to the alignment of the upper and lower metal layers of the bond pads 28, 30, the dielectric material 20, between the two bond pads 28, 30 can be etched out during the passivation etch resulting in weak points or an opening 38 down to the substrate 12. This exposure of the substrate 12 can result in a short on the die and device failure. This problem is overcome by the present invention.

Figure 2A:
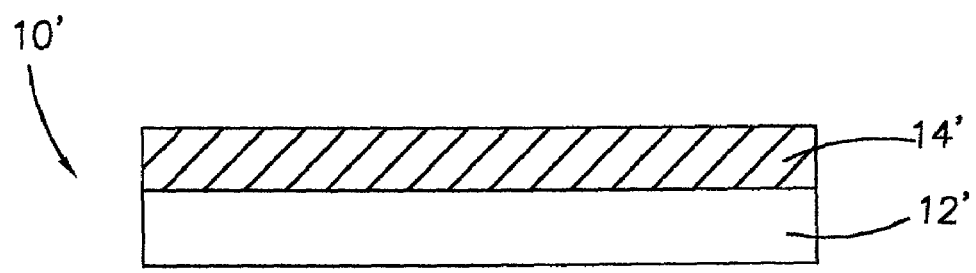
FIGS. 2A–2I are diagrammatic cross-sectional views of a semiconductor wafer at subsequent and sequential processing steps, showing fabrication of a bond pad structure according to an embodiment of a method of the invention.

An embodiment of the method of the present invention is illustrated with reference to FIGS. 2A–2I, in forming a set of bond pads similar to that described with reference to FIGS. 1A–1C. Referring to FIG. 2A, a semiconductor wafer fragment 10' is shown at a preliminary processing step. The wafer fragment 10' is shown as comprising a substrate 12', similar to wafer fragment 10 with various process layers formed thereon.

As shown, a first metal layer 14' has been deposited onto the substrate 12'. Preferably, the first metal layer 14' is formed from aluminum, aluminum alloys, titanium tungsten (Ti:W) alloys, platinum, copper, refractory metal silicides or other metals or metal alloys. The first metal layer 14' can be deposited, for example, by CVD or other method known and used in the art. The first metal layer 14' is in electrical contact with active areas in the substrate 12'. Each pad 28', 30' is connected to its own set of devices, which are combined after bonding of the pads 28', 30'.

Figure 2B:
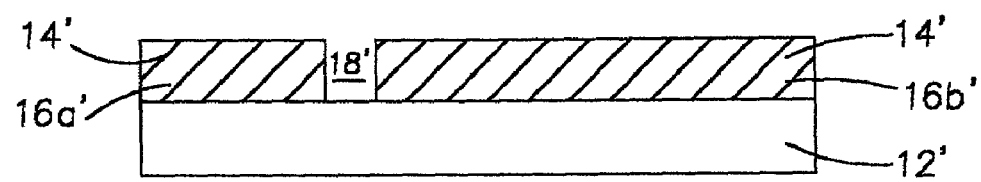

According to the invention, the first metal layer 14' is masked and patterned by dry etching to form a lower metal layer 16a' of the first bond pad 28', and a lower metal layer 16b' of the second bond pad 30', having a space 18' thereinbetween, as illustrated in FIG. 2B. The patterning of the first metal layer 14' is such that a lower metal layer of one of the bond pads extends beneath the upper metal layer of the other bond pad. As depicted, the first metal layer 14' has been patterned and etched such that the lower metal layer 16b' of the second bond pad 30' will extend underneath the subsequently formed upper metal layer 26a' of the first bond pad 28'.

Figure 2C:
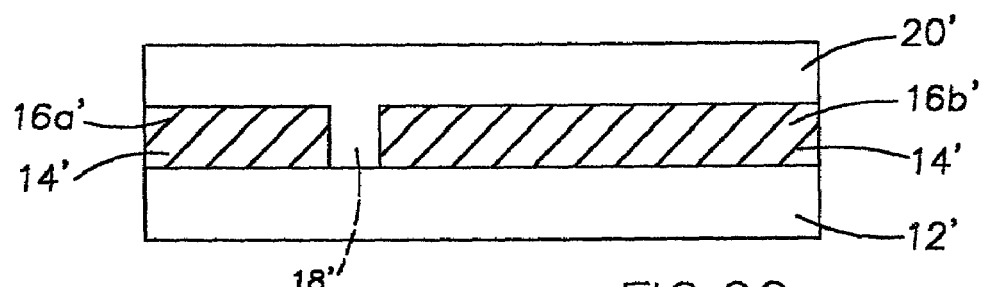

As shown in FIG. 2C, a dielectric layer 20' such as $SiO_2$ is then deposited over the first metal layer 14' and into the space 18' to electrically isolate the two lower metal layers 16a', 16b', and to isolate the first metal layer 14' from the subsequently deposited second metal layer 24'.

Figure 2D:
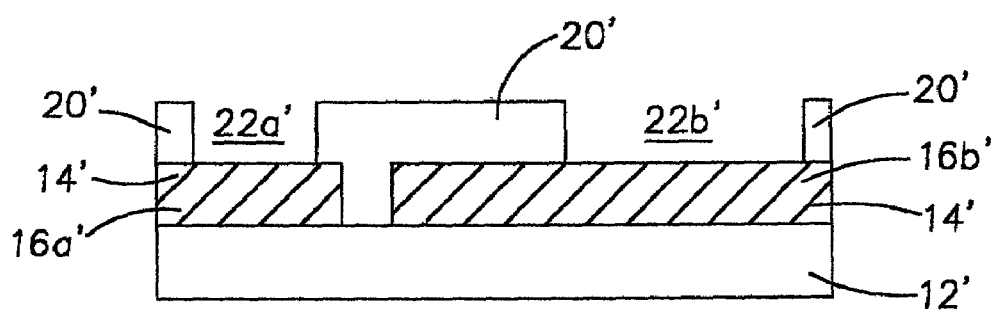

With reference to FIG. 2D, the dielectric layer 20' is selectively etched to provide openings or vias 22a', 22b' to expose each of the first and second metal portions 16a', 16b' of the first metal layer 14'. The openings 22a', 22b' can be formed by conventional masking and silicon etching techniques including, for example, photolithographic and plasma etching processes. The etched opening 22b' to the lower metal layer 16b' is depicted as being larger in diameter than the opening 22b'. With the formation of a larger diameter opening 22b' for the second bond pad 30', the metal portion that is subsequently deposited into the opening 22b' is wider in diameter than the metal portion within the opening 22a'. The etched openings 22a', 22b' can be any proportion to each other to suit the particular need, including equal in diameter.

Figure 2E:
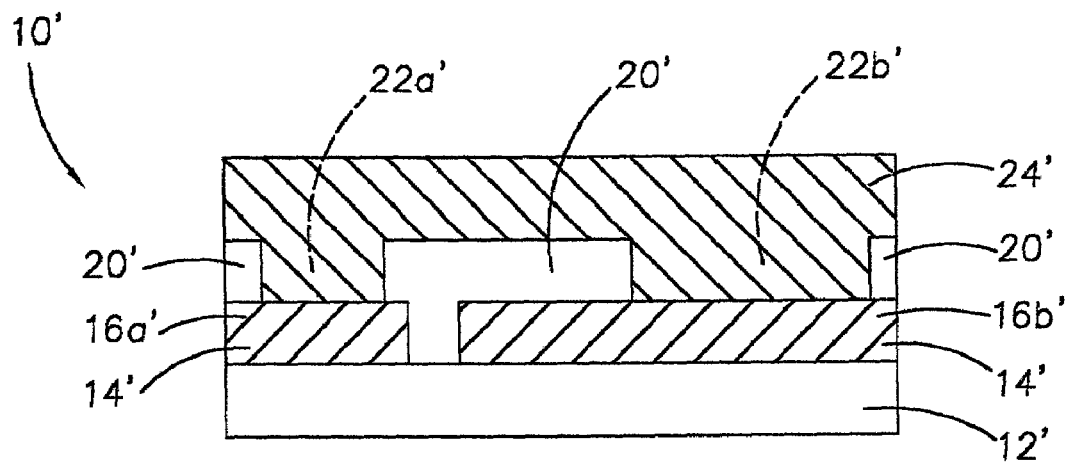

As shown in FIG. 2E, a second metal layer 24' is then deposited into the openings 22a', 22b' and as a layer over the insulative dielectric layer 20'. The second metal layer 24' can comprise the same or different metal as the first metal layer 14', being aluminum in the illustrated example. Preferably, the second metal layer 24' is thicker than the first metal layer 14' in order to reduce resistance in the second metal layer 24'.

Figure 2F:
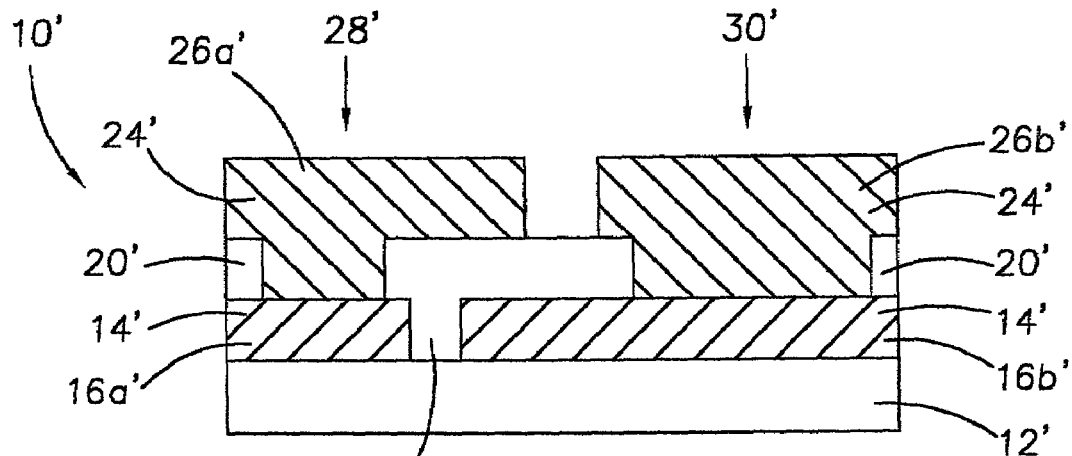

Referring to FIG. 2F, the second metal layer 24' is then patterned and dry etched to form an upper metal layer 26a' of the first bond pad 28' and an upper metal layer 26b' of the second bond pad 30', which are separated by a space 32' thereinbetween. The upper metal layers 26a', 26b' of the first and second bond pads 28', 30' are depicted as generally comprising about the same relative area, but can be any proportion to each as desired.

As depicted, the lower metal layer 16b' of the second bond pad 30' extends underneath the upper metal layer 26a' of the first bond pad 28' to provide an interwoven or staggered layered structure. In another embodiment depicted in FIG. 2F(a), the lower metal layer 16a' of the first bond pad 28' can be patterned and etched to extend beneath the upper metal layer 26b' of the second bond pad 30'. The bond pads 28', 30' can also comprise additional stacked metal layers (e.g., lower metal layers $16a_1'$, $16a_2'$, $16b_1'$, $16b_2'$) that can be formed to provide a staggered construction, as illustrated in FIGS. 2F(b) and 2F(c).

Figure 2G:
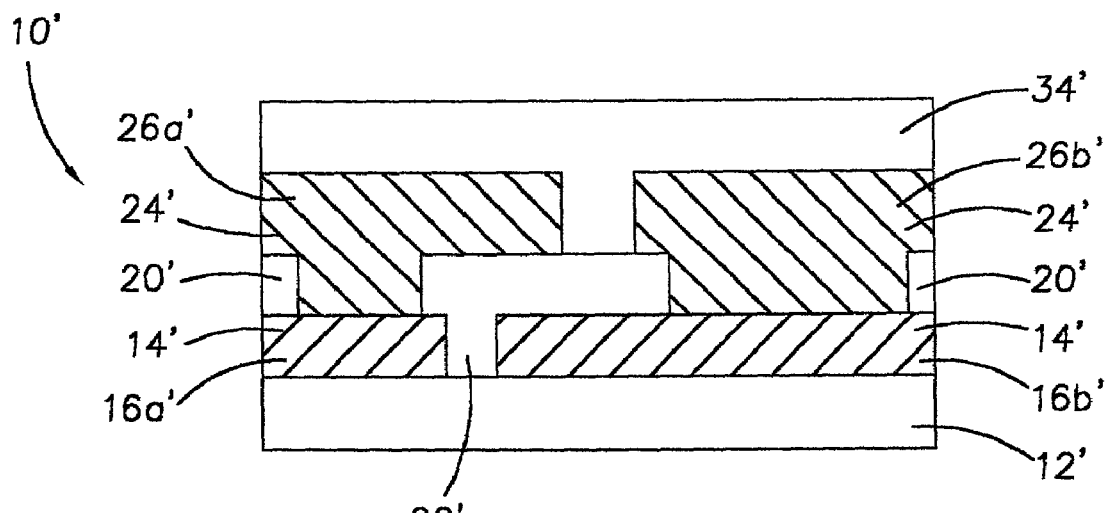
Figure 2F:
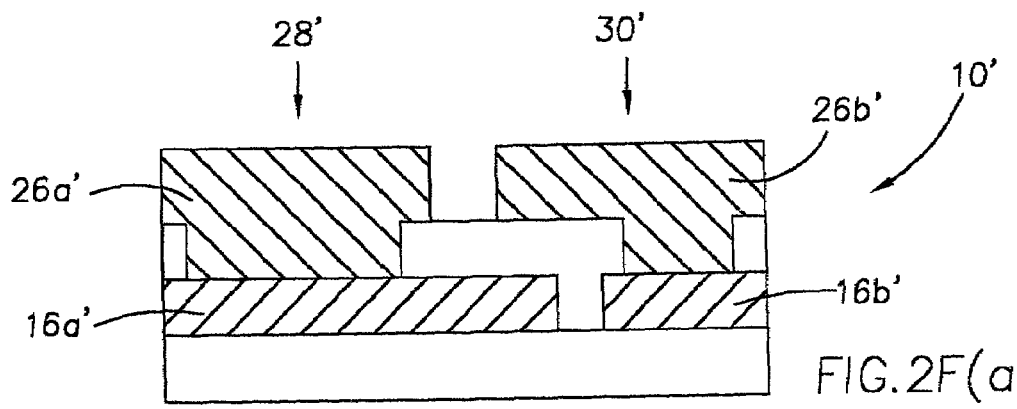
Figure 2F:
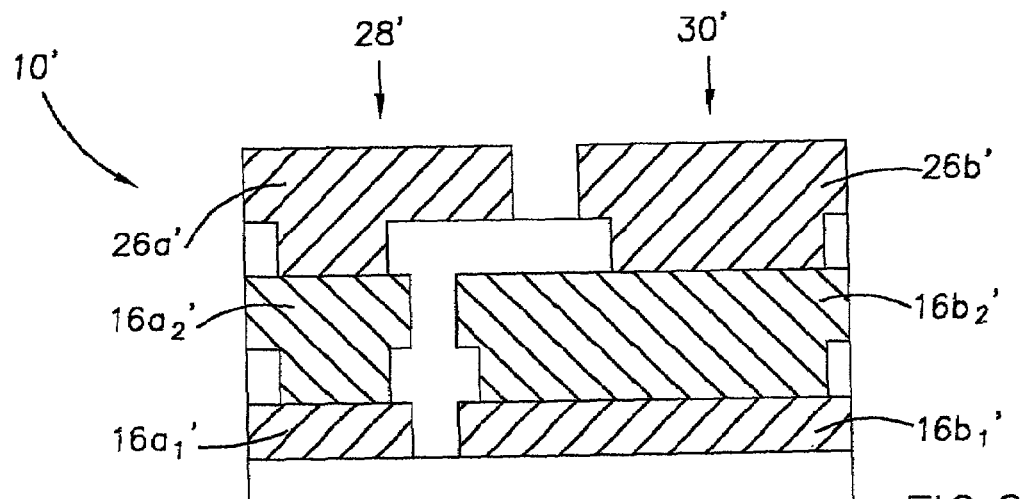
Figure 2F:
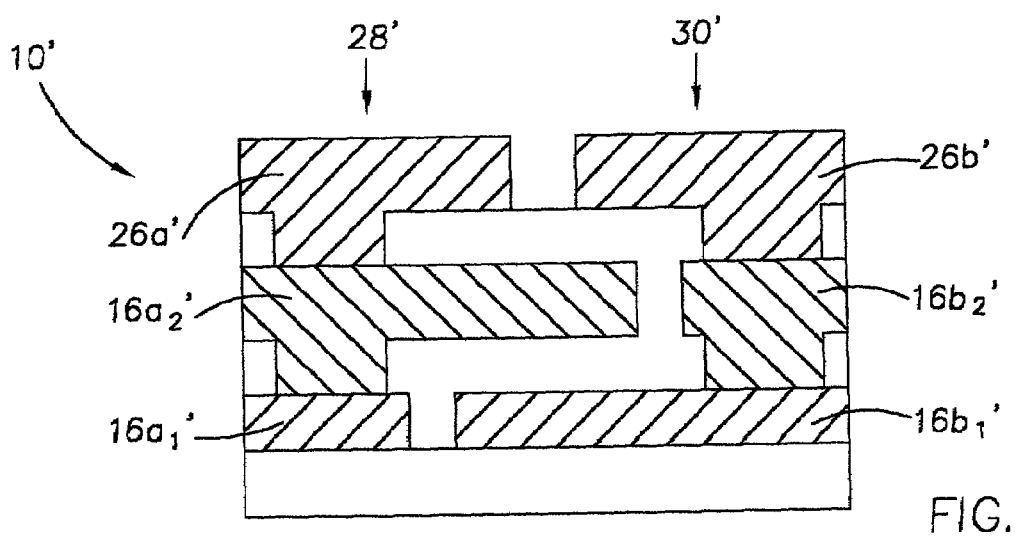

As FIG. 2G illustrates, a protective passivation layer 34' is then formed over the semiconductor wafer 10'. The passivation layer 34', such as CVD PSG or plasma-enhanced CVD silicon nitride, is put down on the wafer surface to seal the device structures from contamination and moisture, and as a scratch protection layer. The passivation layer 34' can also be fabricated, for example, from polyimide, acrylate, epoxy potting compound, acrylic, silicone, polyurethane or other resin, among other protective coating materials, using conventional methods in the art including spin coating, spraying, flow coating, brush coating, among other application techniques.

Figure 2H:
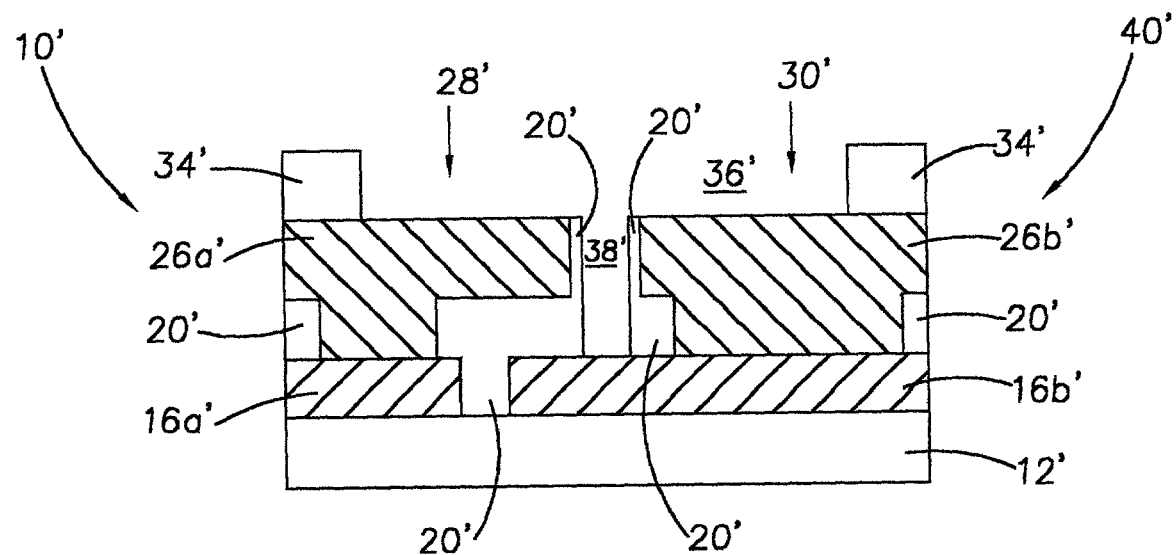

Referring now to FIG. 2H, the passivation layer 34' is then masked and etched by conventional photolithography methods to form a bond pad opening 36' to expose the upper metal layers 26a', 26b' of each of the first bond pad 28' and the second bond pad 30'. The exposed bond pads 28', 30' are typically about 100 by 100 µm in size and separated by a space 32', for example, of about 0.5 µm, or other minimum space or distance allowable for the metal that is utilized.

As with the bond pad structure 40 described with reference to FIGS. 1A–1C, etching of the passivation layer 34' also results in an opening 36' being formed through the dielectric layer 20' between the first and second bond pads 28', 30'. However, advantageously, the offsetting of the lower metal layer 16b' of the second bond pad 30' to extend underneath the upper metal layer 26a' of the first bond pad 28', serves as an etch block during the passivation layer etch, thereby preventing the insulation layer 20' between the two bond pads from being etched down to the substrate 12'.

Figure 2I:
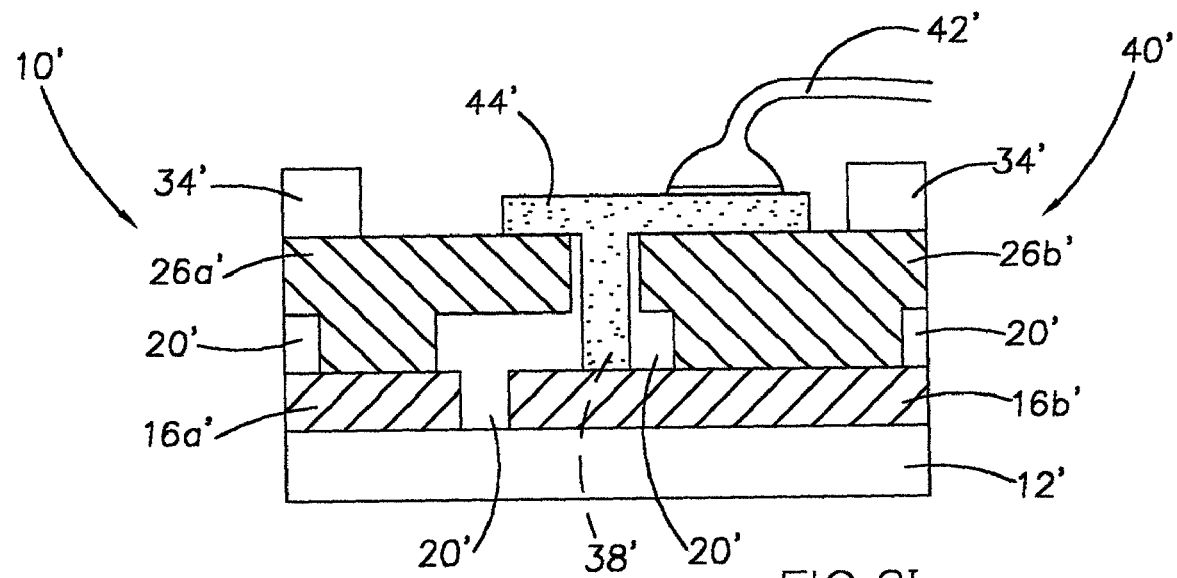

Referring now to FIG. 2I, a bonding wire 42' can then be connected (bonded) to the metal of each of the bond pads and then to the chip package (not shown). In this way, electrical connections are established from the combined pads to an external electrical connection (i.e., the package leads) or to establish an internal-only operational function. During the bonding step, a conductive material 44' such as a solder material attaching the wire 42' to the bond pads can be flowed across the surface of the first and second bond pads 28', 30' and into the space 38' to connect the two bond pads. The bonding wire 42' is not required in all applications, in which case a conductive material (e.g., solder) can be applied to join the pads together.

The bond pad structure 40' is useful in numerous applications including enable operations, supplying and/or retrieving data, powering, grounding, testing circuitry, among other functions. For example, methods of testing an integrated circuit using a test enable bond pad are generally described, for example, in U.S. Pat. Nos. 6,240,535 and 5,796,746 (Farnworth et al., to Micron Technology, Inc.). The integrated circuit (IC) module (not shown) generally includes a terminal receiving a test mode signal, and an IC die having a function circuit and a bond pad. A switching device such as a fuse that is blown or a transistor that is deactivated once testing is complete, is connected with the test mode bond pad between the terminal and the function circuit to conduct the test mode signal to the function circuit. The test mode bond pad is connected to the function circuit and enables a test mode in an I.C. die. An impedance device such as a resistor or anti-fuse, connected between the function circuit and an operational mode signal, supports a difference in voltages between the test mode signal at the function circuit and the operation mode signal. Briefly, a supply voltage is applied to the test mode bond pad, and the function circuit responds to the test mode signal by initiating a test mode in the die to test the circuitry thereon. Once testing of the die is complete, a voltage is applied to disable the test mode, and the impedance device then conducts the operation mode signal to the function circuit. The function circuit responds to the operational mode signal by entering an operational mode in the die in which the die operates in accordance with its intended normal function. Such a set-up allows dice packaged in IC modules to be tested after packaging. A drawback of the described set-up is that in blowing the fuses or using a high voltage to disable the transistor, leakage problems can result.

In an exemplary bond pad structure according to the invention for use in testing and operating circuitry, the first bond pad 28' can comprise an operational mode bond pad that functions in an operational mode. The second bond pad 30' can comprise a test mode bond pad that functions initially in a test mode for testing of circuitry and subsequently, upon completion of the circuit testing and its connection to the first bond pad 28', in an operational mode as a single unit with the first bond pad 28'. The connection between the first and second bond pads 28', 30' can be performed by applying a conductive material 44' (e.g., solder) over at least a portion of each of the bond pads 28', 30' to form an extension between the two pads. It is understood that the first bond pad can be a test mode bond pad and the second bond pad can be an operational mode bond pad. Such a structure is useful for testing an integrated circuit, and functioning in an operational mode once the individual bond pads are connected. The separation of the first and the second bond pads 28', 30' avoids leakage problems that can be caused by high voltage that is applied when the fuse or antifuse is blown at the end of a test operation.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A bond pad structure in a semiconductor die, comprising:
    a first bond pad and a second bond pad connected to a function circuit of the die; each of the bond pads comprising a plurality of lower metal layers and an upper metal layer; with at least one of the lower metal layers of one of the bond pads extending underneath the upper metal layer of the other of the bond pads;
    wherein the first bond pads is operable to receive and supply both a test mode signal and an operational mode signal to the function circuitry, and the second bond pad is operable to receive and supply only an operational mode signal and not a test mode signal to the function circuitry.

2. The bond pad structure of claim 1, wherein the extension of the lower metal layer of the one of the bond pads functions as an etch block to prevent etching of a dielectric layer between the first and second band pads to a substrate underlying the bond pads.

3. The bond pad structure of claim 1, wherein at least two lower metal layers of the one of the bond pads extend underneath the upper metal layer of the other of the bond pads.

4. The bond pad structure of claim 1, further comprising a conductive material interconnecting the first bond pad to the second bond pad.

5. The bond pad structure of claim 4, wherein the conductive material comprises a solder material.

6. The bond pad structure of claim 4, wherein the conductive material overlies at least a portion of each of the first and second bond pads.

7. The bond pad structure of claim 4, further comprising a bonding wire connected to the conductive material.

8. A bond pad structure in a semiconductor die, comprising:
    a first bond pad and a second bond pad connected to a function circuit of the die; each of the bond pads comprising a plurality of lower metal layers and an upper metal layer, with at least one of the lower metal layers of one of the bond pads extending underneath the upper metal layer of the other of the bond pads; wherein the extension of the at least one lower metal layer of the one of the bond pads functions as an etch block to prevent etching of a dielectric layer between the first and second bond pads to a substrate underlying the bond pads; and
    the first bond pad is operable to receive and supply both a test mode signal and an operational mode signal to the function circuitry, and the second bond pad is operable to receive and supply only an operational mode signal and not a test mode signal to the function circuitry.

9. The bond pad structure of claim 8, further comprising a conductive material interconnecting and overlying at least a portion of the first and second bond pads.

10. A bond pad structure in a semiconductor die, comprising:
    a first bond pad and a second bond pad; each of the bond pads comprising at least two lower metal layers and an upper metal layer; with a lower metal layer of the first bond pad extending beneath the upper metal layer of the second bond pad;
    wherein the die comprises function circuitry connected to the bond pads, the first bond pad structured and operable to receive and supply both a test mode signal and an operational mode signal to the function circuitry, and the second bond pad operable to receive and supply only an operational mode signal and not a test mode signal to the function circuitry.

11. A bond pad structure in a semiconductor die, comprising:
    a first bond pad and a second bond pad; each of the bond pads comprising at least two lower metal layers and an upper metal layer; with a lower metal layer of the second bond pad extending beneath the upper metal layer of the first bond pad;
    wherein the die comprises function circuitry connected to the bond pads, the first bond pad structured and operable to receive and supply both a test mode signal and an operational mode signal to the function circuitry, and the second bond pad operable to receive and supply only an operational mode signal and not a test mode signal to the function circuitry.

12. A bond pad structure in a semiconductor die, comprising;
    a first bond pad interconnected to a second bond pad by a conductive material; each of the bond pads comprising at least two lower metal layers and an upper metal layer; with a lower metal layer of one of the bond pads extending underneath the upper metal layer of the other of the bond pads;
    the bond pads connected to function circuitry of the die, the first bond pad operable to receive and supply a test mode signal and an operational mode signal to the function circuitry, and the second bond pad operable to receive and supply only an operational mode signal and not a test mode signal to the function circuitry.

13. The bond pad structure of claim 12, wherein the conductive material overlies a portion of each of the bond pads.

14. The bond pad structure of claim 12, wherein the conductive material comprises a solder material.

15. The bond pad structure of claim 12, further comprising a bonding wire connected to the conductive material.

16. The bond pad structure of claim 12, wherein the extension of the lower metal layer of the one of the bond pads functions as an etch block to prevent etching of a dielectric material between the first and second bond pads to a substrate underlying the bond pads.

17. A bond pad structure in a semiconductor die, comprising:
a first bond pad and a second bond pad positioned within a single passivation opening; the first and second bond pads interconnected by a conductive material overlying at least a portion of each of the bond pads; and each of the bond pads comprising at least two lower metal layers and an upper metal layer; with a lower metal layer of one of the bond pads extending underneath the upper metal layer of the other of the bond pads, and the first and second bond pads connected to function circuitry of the die,
the first bond pad operable to receive and supply both a test mode signal and an operational mode signal to the function circuitry, and the second bond pad operable to receive and supply only an operational mode signal and not a test mode signal to the function circuitry.

18. The bond pad structure of claim 17, further comprising a passivation layer overlying a portion of each of the bond pads, the opening being formed through the passivation layer to expose the bond pads.

19. The bond pad structure of claim 18, wherein the conductive material comprises solder.

20. The bond pad structure of claim 17, further comprising a bonding wire connected to the conductive material.

21. A bond pad structure in a semiconductor die, comprising:
a first metal layer deposited onto a substrate and patterned to form first and second lower metal layer portions having a space thereinbetween;
a dielectric layer deposited over the first and second lower metal layer portions and the substrate within the space, and etched to form openings to each of the first and second lower metal layer portions;
a second metal layer deposited over the dielectric layer and into the openings of the dielectric layer and etched to form a first and second upper metal layer portions overlying and in conductive contact with the first and second lower metal layer portions; the first upper and lower metal layer portions forming a first bond pad, and the second upper and lower metal layer portions forming a second bond pad; and
a conductive material comprising a solder material situated on and interconnecting the first bond pad and the second bond pad;
wherein a lower metal layer portion of one of the bond pads extends beneath the upper metal layer portion of the other of the bond pads, and
the bond pads are connected to function circuitry of the die, and the first bond pad is operable to receive and supply both a test mode signal and an operational mode signal to the function circuitry, and the second bond pad is operable to receive and supply only an operational mode signal and not a test mode signal to the function circuitry.

22. The bond pad structure of claim 21, further comprising a passivation layer formed over the bond pads and etched to form an opening therethrough to expose the first and second bond pads.

23. The bond pad structure of claim 21, wherein the conductive material overlies at least a portion of each of the first and second bond pads.

24. The bond pad structure of claim 21, further comprising a bonding wire connected to the conductive material.

25. A bond pad structure in a semiconductor device, comprising:
a first bond pad and a second bond pad, the bond pads being unconnected; each of the bond pads comprising at least a lower metal layer interconnected to an upper metal layer; with a lower metal layer of one of the bond pads extending beneath the upper metal layer of the other of the bond pads;
the first and second bond pads connected to function circuitry of the device, the function circuitry operational to enable or initiate a test mode in response to a test mode initiate signal, wherein the first bond pad is operable to receive and supply the test mode signal to th function circuitry to enable or initiate the test mode, and further operable to receive and supply an operational mode signal to the function circuitry to initiate an operational mode upon completion of the test mode and connection of the first and second bond pads together, and the second bond pad is operable to receive and supply only an operational mode signal to the function circuitry.

26. The bond pad structure of claim 25, wherein the lower metal layer of the first bond pad extends beneath the upper metal layer of the second bond pad.

27. The bond pad structure of claim 25, wherein the lower metal layer of the second bond pad extends beneath the upper metal layer of the first bond pad.

28. A bond pad structure in a semiconductor device, comprising:
a first bond pad and a second bond pad, the bond pads being unconnected; each of the first and second bond pads comprising at least a lower metal layer interconnected to an upper metal layer; with a lower metal layer of one of the bond pads extending underneath the upper metal layer of the other of the bond pads; and
the first and second bond pads connected to function circuitry of the device, the function circuitry structured to enable or initiate a test mode in response to a test mode initiate signal,
the first bond pad operable to receive and supply the test mode signal to the function circuitry to enable or initiate the test mode in the circuitry, and further operable to receive and supply operational mode signals to the function circuitry to enter an operational mode, and
the second bond pad operable to receive and supply only an operational mode signal and not a test mode signal to the function circuitry.

29. The bond pad structure of claim 28, wherein the lower metal layer of the first bond pad extends underneath the upper metal layer of the second bond pad.

30. The bond pad structure of claim 28, wherein the lower metal layer of the second bond pad extends underneath the upper metal layer of the first bond pad.

31. An integrated circuit die, comprising:
a first bond pad and a second bond pad connected to function circuitry of the die, the first and second bond pads being positioned within a single passivation opening; each of the first and second bond pads comprising at least two lower metal layers and an upper metal layer; with a lower metal layer of one of the bond pads extending underneath the upper metal layer of the other of the bond pads, wherein the first bond pad is functional to receive and supply a test mode signal and an operational mode signal to the function circuitry of the die, and the second bond pad is functional to receive and supply only an operational mode signal and not a test mode signal to the function circuitry.

32. The integrated circuit die of claim 31, wherein the lower metal layer of the first bond pad extends underneath the upper metal layer of the second bond pad.

33. The integrated circuit die of claim 31, wherein the lower metal layer of the second bond pad extends underneath the upper metal layer of the first bond pad.

34. The integrated circuit die of claim 31, further comprising a conductive material interconnecting and overlying at least a portion of the first bond pad and the second bond pad.

35. The integrated circuit die of claim 34, wherein the conductive material comprises solder.

36. The integrated circuit die of claim 34, further comprising a bonding wire connected to at least one of the bond pads.

37. The integrated circuit die of claim 31, wherein the extension of the lower metal layer of the one of the bond pads functions as an etch block to prevent etching of a dielectric material between the first and second bond pads to a substrate underlying the bond pads.

38. An integrated circuit die, comprising:
a first bond pad interconnected to a second bond pad, the first and second bond pads being positioned within a single passivation opening;
each of the first and second bond pads comprising at least two lower metal layers and an upper metal layer; with a lower metal layer of one of the bond pads extending beneath the upper metal layer of the other of the bond pads; wherein the extension of the lower metal layer of the one of the bond pads functions as an etch block to prevent etching of a dielectric layer between the first and second bond pads to a substrate underlying the bond pads, and
the first bond pad is operable to receive and supply a test mode signal and an operational mode signal to function circuitry of the die, and the second bond pad is operable to receive and supply only an operational mode signal and not a test mode signal to the function circuitry.

39. The integrated circuit die of claim 38, wherein the first and second bond pads are interconnected by a conductive material interconnecting overlying and in conductive contact with at least a portion of each of the bond pads.

40. An integrated circuit die, comprising:
a first bond pad interconnected to a second bond pad, the first and second bond pads being positioned within a single passivation opening; each of the first and second bond pads comprising at least two lower metal layers and an upper metal layer; and the lower metal layer of the first bond pad extending beneath the upper metal layer of the second bond pad,
wherein the first and second bond pads are connected to function circuitry of the die; the first bond pad is operable to receive and supply both a test mode signal and an operational mode signal to the function circuitry, and the second bond pad is operable to receive and supply only an operational mode signal and not a test mode signal to the function circuitry.

41. An integrated circuit die, comprising:
a first bond pad interconnected to a second bond pad, the first and second bond pads being positioned within a single passivation opening; each of the first and second bond pads comprising at least two lower metal layers and an upper metal layer; with the lower metal layer of the second bond pad extending beneath the upper metal layer of the first bond pad,
wherein the first and second bond pads are connected to function circuitry of the die; the first bond pad is operable to receive and supply both a test mode signal and an operational mode signal to the function circuitry, and the second bond pad is operable to receive and supply only an operational mode signal and not a test mode signal to the function circuitry.

42. An integrated circuit die, comprising:
a first bond pad and a second bond pad; each of the first and second bond pads comprising at least two lower metal layer and an upper metal layer; the lower metal layer of one of the bond pads extending beneath the upper metal layer of the other of the bond pads; and at least one of the bond pads is adapted to supply data, retrieve data, test a device, or supply various voltages,
wherein the first and second bond pads are connected to function circuitry of the die; the first bond pad is operable to receive and supply both a test mode signal and an operational mode signal to the function circuitry, and the second bond pad is to receive and supply only an operational mode signal and not a test mode signal to the function circuitry.

43. The integrated circuit die of claim 42, further comprising a conductive material interconnecting and overlying at least a portion of each of the bond pads.

44. A semiconductor die comprising a bond pad structure disposed on a substrate and comprising multiple bond pads, each bond pad comprising overlying upper and lower metal layers, and each bond pad comprising two or more lower metal layers, and the upper metal layer of one of the bond pads overlapping the lower metal layer of another of the bond pads;
wherein the bond pads are connected to function circuitry of the die; a first bond pad is operable to receive and supply both a test mode signal and an operational mode signal to the function circuitry, and a second bond pad is operable to receive and supply only an operational mode signal and not a test mode signal to the function circuitry.

45. A semiconductor die comprising a bond pad structure disposed on a substrate and comprising two or more bond pads connected to function circuitry of the die, each bond pad comprising an overlying upper and two or more lower metal layers, and the upper metal layer of one of the bond pads extending over the lower metal layer of another of the bond pads, and
a first bond pad is operable to receive and supply both a test mode signal and an operational mode signal to the function circuitry, and a second bond pad is operable to receive and supply only an operational mode signal and not a test mode signal to the function circuitry.

46. A bond pad structure disposed on a substrate and comprising:
a lower metal layer disposed on the substrate and comprising first and second portions separated by a space therebetween;

a dielectric layer overlying the lower metal layer and the substrate within the space; one or more openings extending through the dielectric layer to each of the first and second lower metal portions; and an upper metal layer disposed over the dielectric layer and within the openings in the dielectric layer in contact with the first and second portions of the lower metal layer the upper metal layer comprising first and second portions, the first upper metal portion positioned over and connected to the first lower metal portion to form a first bond pad, and the second upper metal portion positioned over and connected to the second lower metal portion to form a second bond pad; and the upper metal portion of one of the bond pads extends over the lower metal portion of the other bond pad; and a conductive solder material situated on and interconnecting the first bond pad and the second bond pad;

wherein the bond pads are connected to function circuitry, and the first bond pad is operable to receive and supply both a test mode signal and an operational mode signal to the function circuitry, and the second bond pad is adapted operable to receive and supply only an operational mode signal and not a test mode signal to the function circuitry.

47. An integrated circuit supported by a substrate and comprising:

a bond pad structure, the bond pad structure comprising two or more bond pads, each bond pad comprising an overlying upper and two or more lower metal layers, and the upper metal layer of one of the bond pads extending over the lower metal layer of another of the bond pads, and the bond pads are connected to the circuit, and a first bond pad is operable to receive and supply both a test mode signal and an operational mode signal to the circuit, and a second bond pad is operable to receive and supply only an operational mode signal and not a test mode signal to the circuit.

48. An integrated circuit supported by a substrate and comprising:

a first bond pad and a second bond pad; each of the bond pads comprising two or more lower metal layers and an overlying upper metal layer; and the upper metal layer of one of the bond pads extends beyond at least one of the two or more lower metal layers of the one bond pad and over at least one of the two or more lower metal layers of the other of the bond pads, and the bond pads are connected to the circuit, and the first bond pad is operable to receive and supply both a test mode signal and an operational mode signal to the circuit, and the second bond pad is operable to receive and supply only an operational mode signal and not a test mode signal to the circuit.

49. An integrated circuit supported by a substrate and comprising a bond pad structure, the bond pad structure comprising:

a lower metal layer comprising first and second portions with a space therebetween;

a dielectric layer overlying the lower metal layer and within the space; at least one opening extending through the dielectric layer to each of the first and second lower metal portions; and an upper metal layer overlying the dielectric layer and within the openings in the dielectric layer in contact with the first and second portions of the lower metal layer; the upper metal layer comprising first and second portions, the first upper metal portion positioned over and connected to the first lower metal portion to form a first bond pad, and the second upper metal portion positioned over and connected to the second lower metal portion to form a second bond pad the upper metal portion of one of the bond pads extends over the lower metal portion of the other bond pad; and the first and second bond pads being unconnected;

wherein the bond pads are connected to the circuit, and the first bond pad is operable to receive and supply both a test mode signal and an operational mode signal to the circuit, and the second bond pad is operable to receive and supply only an operational mode signal and not a test mode signal to the circuit.

50. A semiconductor die, comprising:

a substrate; and a bond pad structure disposed on the substrate, the bond pad structure comprising multiple bond pads, each bond pad comprising an overlying upper and two or more lower metal layers, and the upper metal layer of one of the bond pads overlaps at least one of the lower metal layers of another of the bond pads, wherein the bond pads are connected to a function circuit, and a first bond pad is operable to receive and supply both a test mode signal and an operational mode signal to the function circuit, and a second bond pad is operable to receive and supply only an operational mode signal and not a test mode signal to the function circuit.

51. A semiconductor wafer, comprising:

a substrate and a bond pad structure disposed on the substrate, the bond pad structure comprising a first bond pad and a second bond pad; each of the bond pads comprising a lower metal layer and an overlying upper metal layer; and the upper metal layer of one of the bond pads extends beyond the lower metal layer of the one bond pad and over the lower metal layer of the other of the bond pads;

wherein the bond pads are connected to a function circuit on wafer, and first bond pad is operable to receive and supply both a test mode signal and an operational mode signal to the function circuit, and the second bond pad is operable to receive and supply only an operational mode signal and not a test mode signal to the function circuit.

52. A semiconductor wafer, comprising:

a semiconductor die comprising a substrate and a bond pad structure disposed on the substrate, the bond pad structure comprising a first bond pad and a second bond pad interconnected by a conductive solder material; each bond pad comprising an upper metal layer overlying two or more lower metal layers, the upper metal layer of one of the bond pads overlapping at least one of the lower metal layers of another of the bond pads;

wherein the bond pads are connected to a function circuit of the die, and the first bond pad is operable to receive and supply both a test mode signal and an operational mode signal to the function circuit, and the second bond pad is operable to receive and supply only an operational mode signal and not a test mode signal to the function circuit.

53. A semiconductor wafer, comprising:

a substrate and a bond pad structure disposed on the substrate, the bond pad structure comprising a first bond pad and a second bond pad interconnected by a conductive solder material; each bond pad comprising an upper metal layer overlying two or more lower metal layers, the upper metal layer of one of the bond pads overlapping at least one of the lower metal layers of another of the bond pads;

wherein the bond pads are connected to a function circuit of the die, and the first bond pad is operable to receive and supply both a test mode signal and an operational mode signal to the function circuit, and the second bond pad is operable to receive and supply only an operational mode signal and not a test mode signal to the function circuit.

* * * * *